Sept. 9, 1958 G. A. GAGNON 2,851,145

ELECTRONIC COMPONENT ATTACHING MACHINE

Filed March 26, 1956 6 Sheets-Sheet 1

INVENTOR.
George A. Gagnon

BY

J. D. Douglass
His ATTORNEY

Sept. 9, 1958 G. A. GAGNON 2,851,145

ELECTRONIC COMPONENT ATTACHING MACHINE

Filed March 26, 1956 6 Sheets-Sheet 2

INVENTOR.
George A. Gagnon
BY
J. D. Douglas
His ATTORNEY

INVENTOR.
George A. Gagnon
BY
J. D. Douglas
His ATTORNEY

INVENTOR.
George A. Gagnon
BY
J. H. Douglas
His ATTORNEY

Sept. 9, 1958 G. A. GAGNON 2,851,145

ELECTRONIC COMPONENT ATTACHING MACHINE

Filed March 26, 1956 6 Sheets-Sheet 5

INVENTOR.
George A. Gagnon
BY
J. W. Douglas
his ATTORNEY

ELECTRONIC COMPONENT ATTACHING MACHINE

Filed March 26, 1956

6 Sheets-Sheet 6

INVENTOR.
George A. Gagnon
BY
J. D. Douglas
His ATTORNEY 2,851,145
Patented Sept. 9, 1958

2,851,145

ELECTRONIC COMPONENT ATTACHING MACHINE

George A. Gagnon, Chicago, Ill., assignor to Admiral Corporation, Chicago, Ill., a corporation of Delaware Application March 26, 1956, Serial No. 573,977

11 Claims. (Cl. 198—19)

This invention relates to improvements in apparatus for the automatic placement of circuit components on circuit boards such as are employed in radio and television receivers although the invention is not limited to manufacture of radio or television apparatus.

More specificially, the invention contemplates mechanism for attaching circuit components to a circuit board or blank, the blank comprising a plate or sheet of insulation material having conductors formed on one of its surfaces by any of a number of well-known processes. This assembly operation is effected by the novel apparatus prior to soldering of the components to conductors on the blank.

Where printed circuits are employed in the electronic industry, it has been the custom to secure the various components to the circuit boards manually, before soldering the components to the conductive portions of the boards. A considerable item in the cost of the circuit assemblies has therefore been due to labor necessary in associating the components in assembly with the blanks prior to application of solder to the blanks for permanently securing the components to the conductors.

Considerable work has been carried on in developing apparatus for coupling circuit components to circuit blanks. The present invention contemplates improvements in such machines, the improvements involving economy of parts and ease of operation of the machine, and also includes features which are improvements over their counterparts of a machine disclosed in my co-pending application filed September 9, 1955, Serial No. 533,351.

In the use of the so-called automatic machines it has been difficult to adjust the machine for the handling of circuit boards of different sizes. By the present invention the machine can be readily adapted to handle circuit boards of various widths without materially changing the structure of the machine.

The present machine includes magazine means for retaining a stack of circuit boards in superimposed relation to each other. The magazine is at the end of a row of horizontal board supports, also in spaced relation to each other, and from which the magazine is also spaced. Successive lowermost boards are removed from the magazine by a transport mechanism which includes an ejector member that oscillates horizontally and engages, on its forward movement, one of the ends of a lowermost magazined board and slides the bottom blank out from under the remaining magazined boards and passes it through a gate in the side of the magazine nearest the first or adjacent support. In this operation the bottom board is confined for movement in a linear course by a guide rail, extending from the magazine past the row of supports, and a retaining rail, extending from the magazine to the support adjacent thereto. The guide rail has a groove, throughout its length, facing the retaining rail and is movable to an upper position wherein one end of the groove receives one of the marginal edges of the board and supports it in cantilevered relation thereto while the retainer rail retains the board in the groove by engaging its opposite edge until the board is over the first support. Then the board is lowered to the support by sequential movement of the rail to a lower position.

After the board has been stationed on the first support it receives one or more circuit components. This having been carried out, the sequence of operation involves removal of the board from the first support by movement of rail to its upper position wherein the board is engaged by transfer mechanism, operative in unison with the ejector, by which the board is slid along the groove to a point over the next support. Concurrent with this operation the succeeding lowest magazined board is withdrawn from the magazine in the manner already indicated. Simultaneously both boards then receive and have secured thereto components from devices above each station. They are then transferred to succeeding supports where they receive additional components and are, of course, replaced by other boards as previously described. The components are therefore applied at stations, any number of which may be provided. A plurality of components may be applied to a board at any of the stations.

Additional advantages of this invention will be apparent from the following description when considered in conjunction with the accompanying drawings in which.

Figures 1, 2, 3, 4:
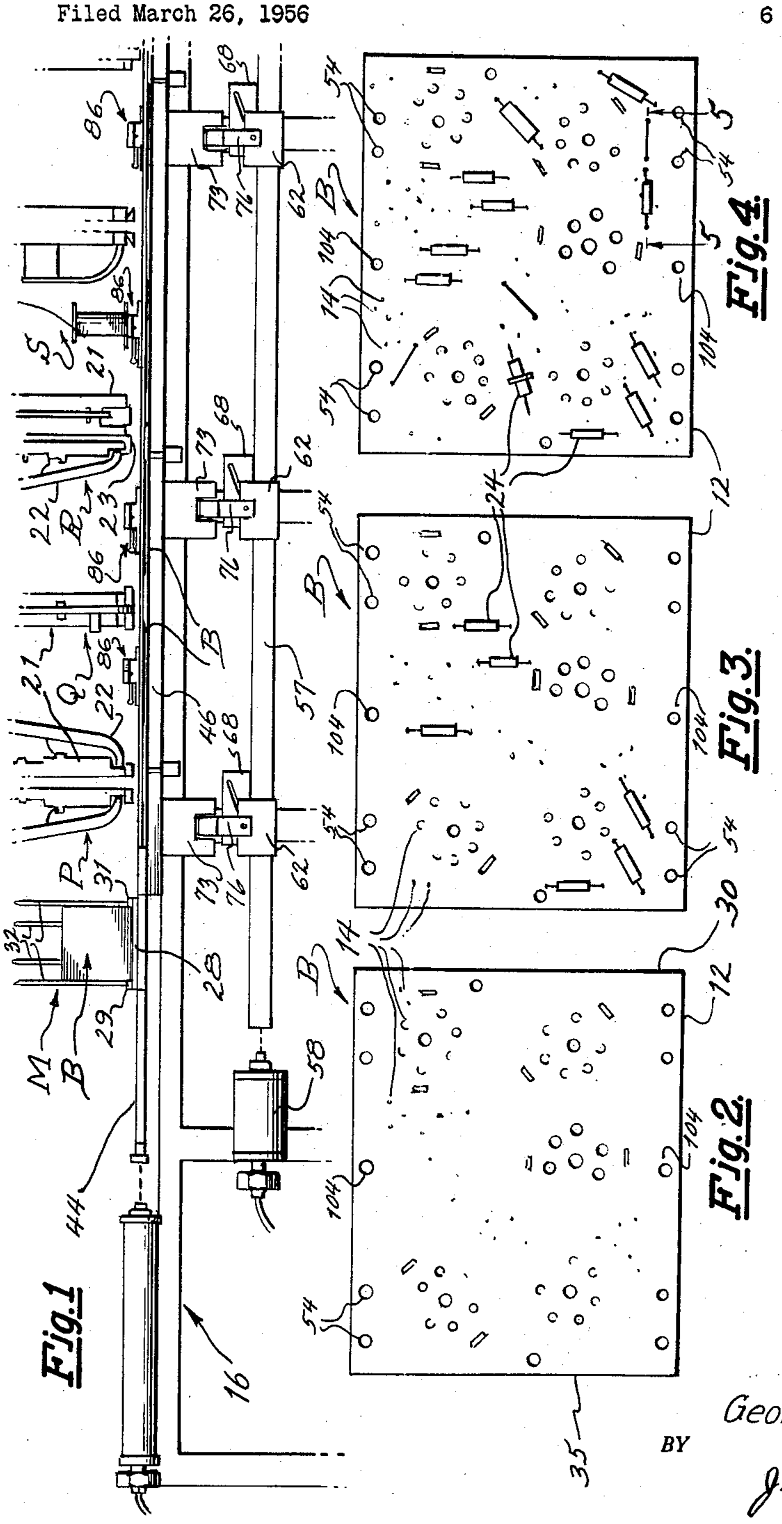
Fig. 1, is a fragmentary diagrammatic view of a component affixing machine in which the invention is incorporated.
Fig. 2, is a top plan view of a board before any of the components have been applied thereto.
Fig. 3, is a view corresponding to Fig. 2, some components having been applied to the board.
Fig. 4, is a view corresponding to Fig. 3, additional components having been applied to the board.
Figure 5:
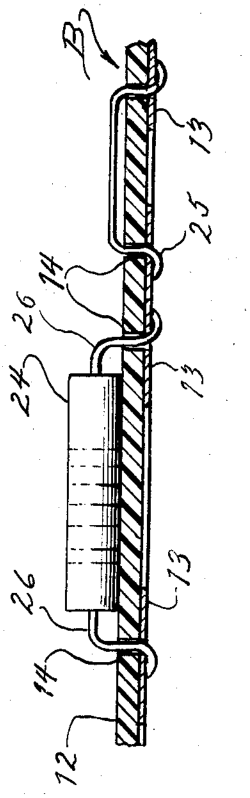
Fig. 5, is a vertical section taken on line 5—5 of Fig. 4.

Throughout the drawings the reference character B is used to denote a "printed" circuit board or blank. It is best shown in Figs. 2, 3 and 4 and comprises a rectangular plate 12 of some suitable dielectric material such as Bakelite about $\frac{1}{16}$ of an inch in thickness. One side of the plate may be provided with a multiplicity of metal conductors 13 which may be formed thereon by a process referred to by the trade as "printing." The process will not be described, however, since it is no part of the present invention. The purpose of the printed conductors, of course, is to take the place of wires ordinarily joining elements of the numerous circuit components of an electronic circuit such as are common in radio or television receivers. Prior to association of components with the plate 2, a multiplicity of apertures 14 are provided in the blank. One of the functions of the invention is the means it affords for inserting conductors or leads, to be found on circuit components, into the apertures from the reverse side of the plate 12; i. e., the side opposite the side on which the conductors are carried.

Although condensers and resistors are typical components applicable to the blank B, tube sockets and coil units having connector lugs are also contemplated. In fact, any medium applicable to the blank for eventual soldered association therewith may be so regarded.

Figures 9, 10, 11, 12:
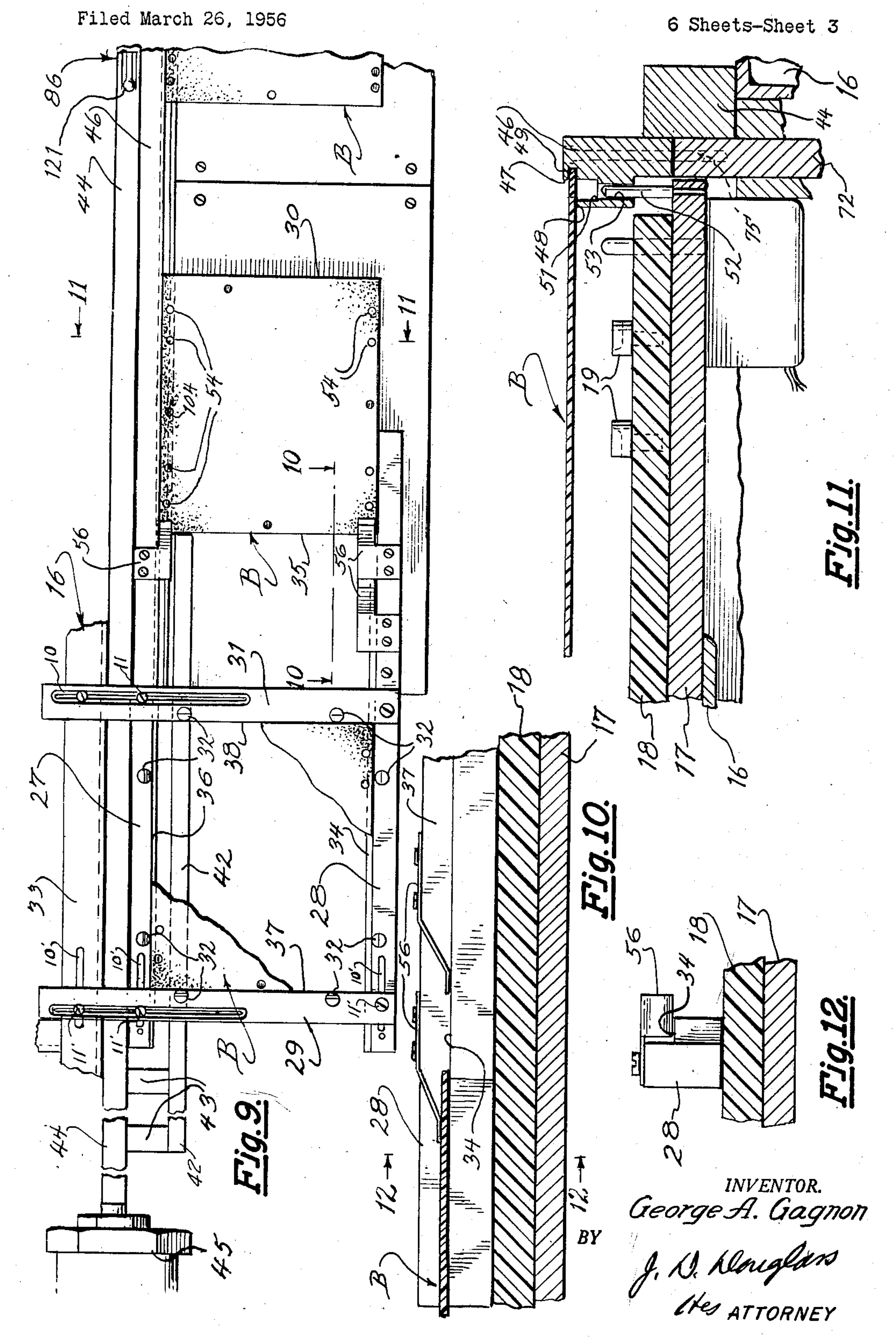
Fig. 9, is a top plan view of the magazine showing the ejector member at the forward extremity of its operation.
Fig. 10, is a fragmentary vertical section taken on line 10—10 of Fig. 9.
Fig. 11, is a vertical section taken on line 11—11 of Fig. 9.
Fig. 12, is a fragmentary vertical section taken on line 12—12 of Fig. 10.

The invention is embodied in a machine having a frame 16 which may take any suitable form to afford horizontal support for an elongated plate 17, Figs. 9 to 11, fixed to the frame, and on which is superimposed a plate 18 of non-conductive material such as Bakelite. The plate 18 affords support for a pair, pairs or groups of anvils 19 at spaced points thereon and electrically insulates each of the anvils from each other and the plate 17; the anvils besides performing their usual operation also function as terminals in an electrical control circuit not herein described in detail since they form no part of the present invention.

Above each group of anvils 19 is supported one or more component affixing units 21, preferably from points on the frame 16 beside the plates 17 and 18 referred to as component affixing stations designated in Fig. 1 as P, Q, R, etc. Each of the stations may include a single component unit, one or more similar units or dissimilar units. Their structure will not be described in detail since per se they are no part of the present invention. It may be timely to note, however, that each of the units includes combined magazine and component feeding mechanism 22 and a vertically moving member 23 for carrying a circuit component 24 downward and inserting the connecting elements 26 thereof through the apertures 14 in the boards when the apertures are located over the anvils.

At the end of the row of stations and spaced from the station P, is a magazine M, Fig. 1. It includes horizontal, parallel inner and outer rails 27 and 28 respectively, Fig. 6. They, in turn, are in adjustably fixed relation to each other by a rear beam 29 and a front beam 31 superimposed on the rails to which they are attached. Additionally, the inner rail 27, outer rail 28 and beams 29 and 31 bear pairs of rods 32 extending vertically upward therefrom to provide a fence structure within which a stack of the blanks B having front edges 30 and trailing edges 35 may be accommodated in horizontal, superimposed relation to each other. Any suitable means may be employed for support of the fence structure. For example, the beams 29 and 31 may continue inwardly of the machine and be bolted to the frame 16, spacers 33, Figs. 7 to 9, being employed between the frame and beams to govern the elevation of the magazine relative to the plates 18 for reasons later to become apparent.

As can be seen in Figs. 6 to 9, the beams 29 and 31 are provided with longitudinally extending slots 10 through which the screws 11, which hold the beams to the back rail 27, extend, to provide for adjustment of the front rail 28 to and from the rear rail 27 to enable the magazine to accommodate boards of various sizes. Likewise the rails 27 and 28 are provided with longitudinally extending slots 10′ near their ends through which the screws 11′ that hold the beam 29, extend, in order that the distance between the beams 29 and 31 may be adjusted. The spacer 33 is likewise provided with a slot 10′ to facilitate adjustment.

Figures 6, 7, 8:
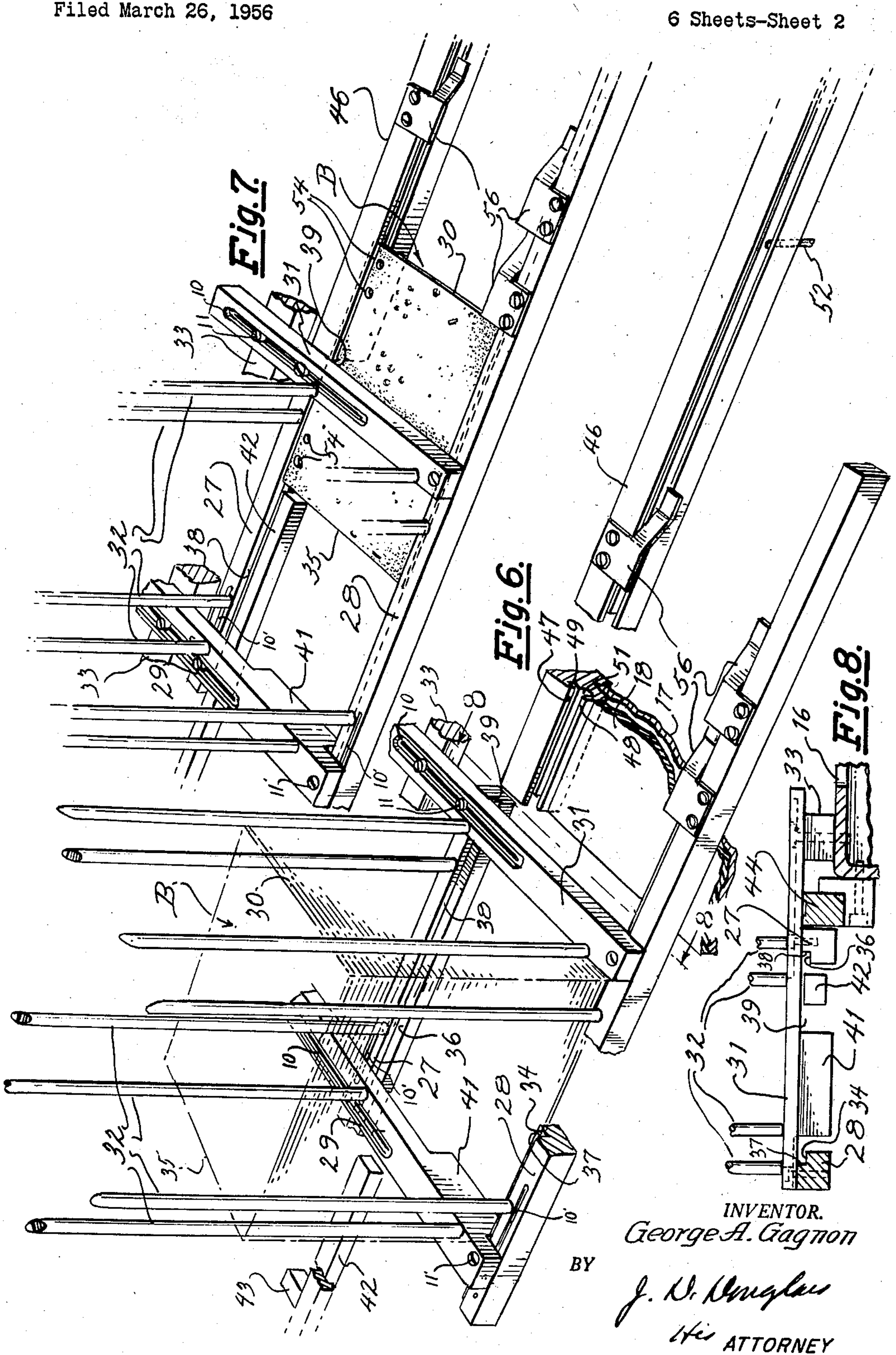
Fig. 6, is a fragmentary perspective view of the magazine and mechanism associated therewith.
Fig. 7, is also a fragmentary view corresponding to Fig. 6, some of the parts being shown in other positions.
Fig. 8, is a vertical section taken on line 8—8 of Fig. 6.

The rails 27 and 28 are L-shaped in cross-section thereby providing ledges 34 and 36, and extending toward each other. The ledges 34 and 36 afford bottom support for the magazined boards while the adjacent vertical sides 37 and 38, normal to the ledges, in addition to the rods 32, confine a stack of boards B within the magazine. The ledges 34 and 36 are below the rail 31 a distance slightly greater than the thickness of one of the boards B, but less than the combined thicknesses of two boards. This affords a gate 39, beneath the beam 31, for the lowest of the magazined boards to be passed through as it is slid along the ledges as best illustrated in Fig. 7. The beam 29 is formed with a portion 41, Fig. 6, extending downward below the level of the ledges 34 and 36 to preclude displacement of the bottom board away from the gate 39.

The operation of removing the lowermost of the magazined boards is performed by an ejector member or horizontal rod 42, Fig. 9. It includes a lateral arm portion 43 fixed to a transfer member or rod 44 arranged to be reciprocated by its connection to a fluid pressure motor 45. The beam portion 41 extends downward to a level below the top of the rod 42 but is of reduced length, to permit the rod 42 to pass into the lower part of the magazine. The free end of rod 42 is arranged at an elevation for engaging the lowest of the magazined boards without engaging any of the other boards in the magazine during a forward stroke of the motor 45. From its normal position, Fig. 6, exteriorly of the magazine, the rod moves the lowermost board through the gate 39 into position at the station P.

Figures 13, 14:
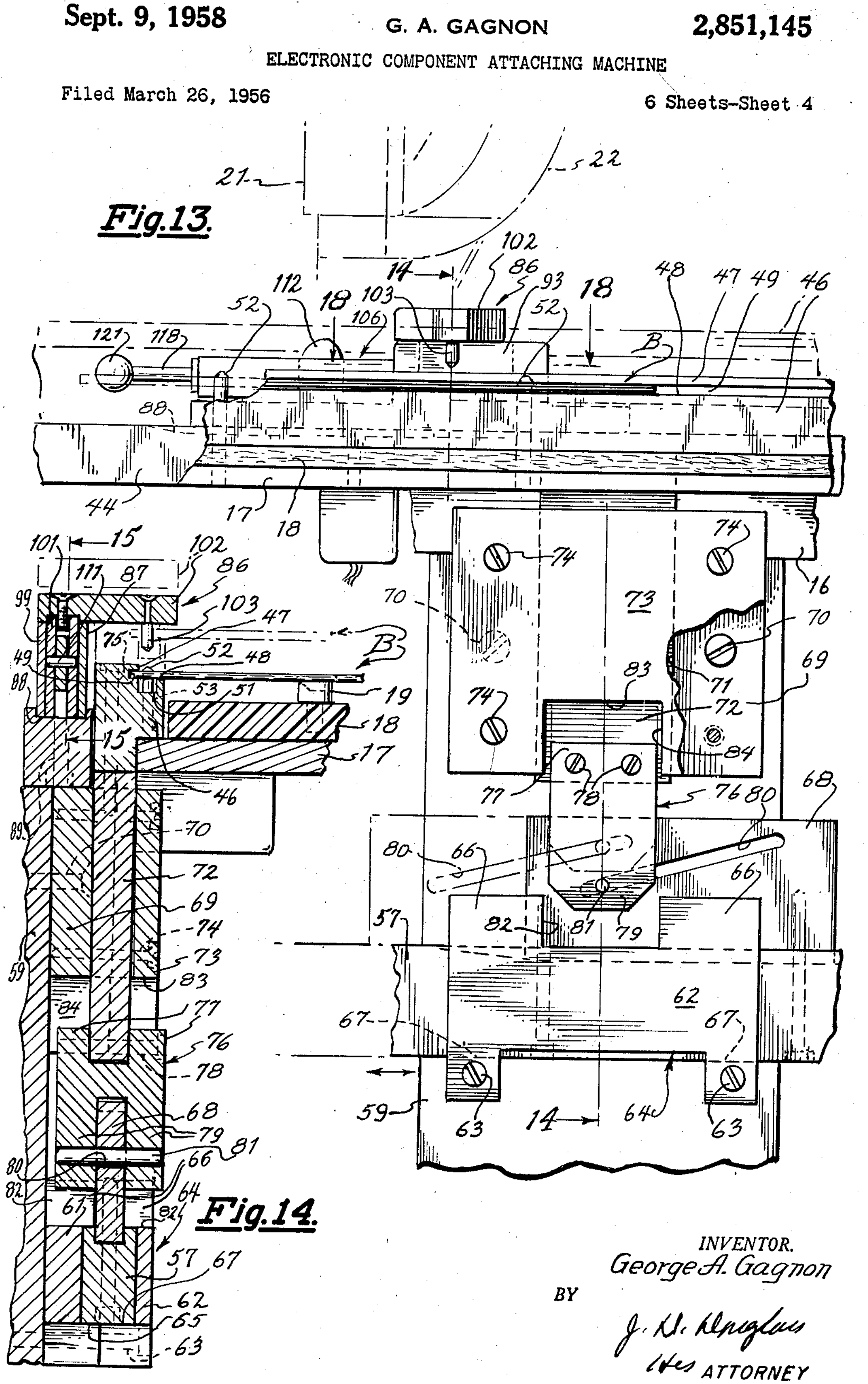
Fig. 13, is a fragmentary front elevational view, drawn to an enlarged scale, of mechanism of one of the component affixing stations, parts being shown broken away.
Fig. 14, is a vertical section taken on line 14—14 of Fig. 13.

Novel means are provided for guiding a board, ejected by the rod 42, in a horizontal linear course. The means comprises a horizontal guide rail 46 extending throughout the length of the row of stations P, Q, R, etc. Upwardly thereof and at its side the rail 46 is formed with intersecting vertical and horizontal walls 47 and 48 (Fig. 14). The vertical wall 47 is formed with a guide or track groove 49 therein the lower edge of which is at the level of the wall 48. The wall 48, on the other hand, has a clearance groove 51 therein, one of the edges of which coincides with the wall 47. Both of the grooves 49 and 51, like the walls 47 and 48, extend throughout the length of the rail 46, which is arranged to be moved between lower and upper positions (Figs. 6 and 7) by means later to be described.

Although the rail 28 is fixed and extends to the station P, the rail 27 terminates just short of the guide rail 46 at the exterior of the magazine M. When the rail 46 is in its upper position, the groove 49 registers with the adjacent end of the gate 39 so that as the lowermost of the magazined boards is passed through the gate 39 the board is received by the groove 49. During this operation, and until the ejected board reaches the station P, the rail 28 engages one of the marginal edges of the board to retain the opposite edge thereof in the groove 49 and thereby provides, with the rail 46, a course for said board between the magazine and adjacent component affixing station.

The operation of the rod 42 is therefore timed to move when the rail 46 is in its upper position where the rail remains until after the rod has reached the forward end of its stroke.

Following movement of the rod 42 to the forward end of its stroke, the board, thereby removed from the magazine, occupies a predetermined position in the station P. Immediately after it reaches this position, the board is carried downward by movement of the rail 46 to its lower position to position preselected pairs of the holes 14 over the anvils of this station. To afford clearance for the board to be carried downward, the ledge 34 terminates just short of the board's trailing edge 35 when it is in the position it is moved by the rod 42 at the forward end of its stroke.

Although the ejected blank is lowered by the rail 46 as the latter moves to its lower position, additional means are provided to guide the blank in its downward course so that the preselected holes 14 are accurately associated with the anvils prior to operation of the units 21. The means includes a pair of vertical guide pins 52 (Fig. 13). They are supported by the plate 17, Fig. 11, at points thereon immediately below the groove 51 and arranged to pass freely through holes 53 (Fig. 14) in the rail 46. And although the pins 52 extend to a level slightly above the level of the groove 49, when the rail is in its lower position, the pins are below the level of the groove 49 when the rail 46 is in its upper position. The board B, on the other hand, is formed with holes 54, at its marginal edges, in an arrangement to receive the pins as the board is lowered by the rail. While thus impaled, a selected pair or pairs of the apertures 14 are positively stationed over the anvils 19.

Inertia reducing means for the boards is provided in that part of their course between the magazine M and station P, to eliminate the possibility of the boards overshooting their predetermined position in the station P, due to the rapidity of their ejection from the magazine. While other means may be employed for reducing the inertia in the boards to prevent their movement ahead of the rod 42 when it stops at the end of its forward stroke, suitable means contemplates leaf springs 56 for frictionally engaging the blanks. Preferably the springs 56 are L-shaped and are fixed to the tops of the rails 28 and 46. The springs slant downward adequately to engage and exert pressure on the upper surface of a board while it is supported by the ledge 34. The consequent friction between the springs 56 and board B reduces or eliminates a tendency on the part of the latter to move ahead of the rod 42 when it stops at the end of its forward stroke, so that the holes 54 are not carried past the axes of the pins 52.

The vertical movement of the rail 46 is due to reciprocatory operation of a horizontal cam rod or cam carrier 57. It may be rectangular in cross-section and derives its motion from a fluid pressure motor 58 (Fig. 1) to which it is connected. For its support, the frame 16 is provided with a plurality of horizontally-spaced plates or vertical pads 59, Fig. 13, one of which is associated with each of the stations P, Q, R, etc. Additionally, support for the carrier 57, at each of the stations, includes an inner bearer member 61 and an outer bearer member 62, Fig. 14, both of which are bolted to one of the pads at 63. In this relationship the members provide a composite bearing 64 of U-shaped vertical section embracing the opposed vertical sides of the cam carrier 57. Additionally, the members 61 and 62 are formed upwardly thereof, with finger portions 66 extending toward each other, Fig. 14, over the top of said carrier to confine the same in slidable association with seat portions 65 and 67 on the bearing 64. The fingers 66 are spaced to accommodate therebetween a vertical, rectangular cam plate 68 fixed at its lower edge to the carrier 57.

Above the level of the cam plate 68 is a vertical guide member 69. It is clamped to the pad 59 by screws 70, passing through the member 69 and anchored in said pad. Horizontally, the member 69 is U-shaped in transverse section and so includes a vertical channel 71 which accommodates a support link 72 confined in the channel by a cover plate 73, the plate 73 being secured by screws 74 passing freely through the plate and threaded in the member 69.

The link 72 is connected to the cam plate 68 by a follower link 76. The latter is of H-shaped vertical section (Fig. 14) and includes upper arms 77 embracing the link 72 to which the follower link is pinned at 78. The link 76 also includes a pair of lower arms 79 embracing the plate 68 which is formed with an oblique cam slot or positive motion cam 80 therein for receiving a follower pin 81, carried by the arms 79. The link 72 is secured, at its upper end, to the guide rail 46 by screws 75 passing downward therethrough and into threaded relation to the link 72. It will be apparent that as the rod 57 is moved to the left, prior to ejection of a board B from the magazine M, the follower 81 is moved upward carrying with it the links 72 and 76 and rail 46. After the ejected board B has been delivered to the station P the sequential, timed operation of the rod 57 involves movement thereof to the right with consequent motion of the rail 46 downward to its lowest position. In order that the link 76 may have freedom for motion, the lower bearing 64 is formed, upwardly thereof, with clearance notches 82. Also for clearance, the plate 73 is notched at 83 and the member 69 notched at 84. A repetition of the mechanism, just described. for moving the rail 46 vertically is to be found at each of the stations. Hence the rail 46 derives motion at a plurality of points for its operation.

Figure 15:
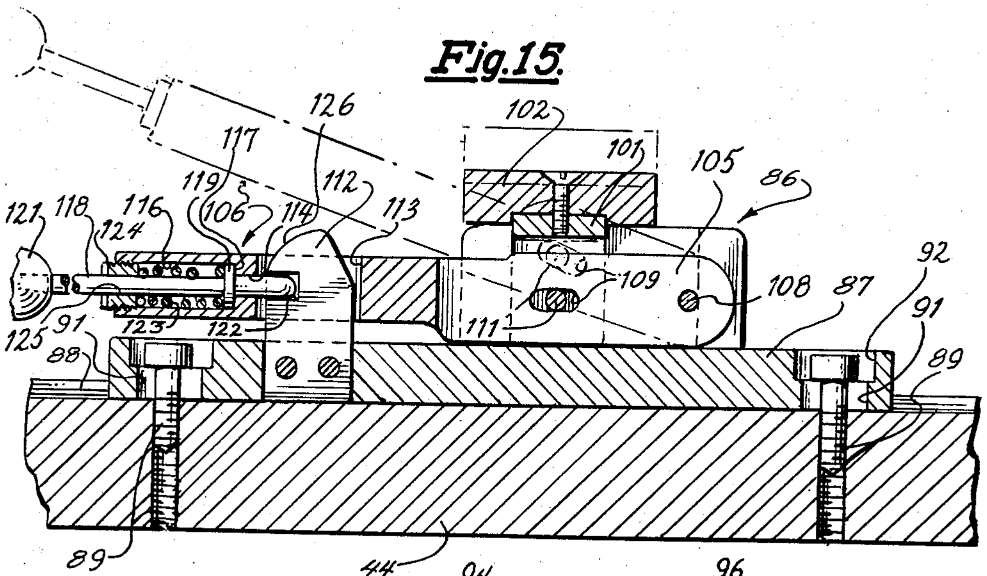
Fig. 15, is a vertical section, drawn to an enlarged scale, taken on line 15—15 of Fig. 14.
Figure 16:
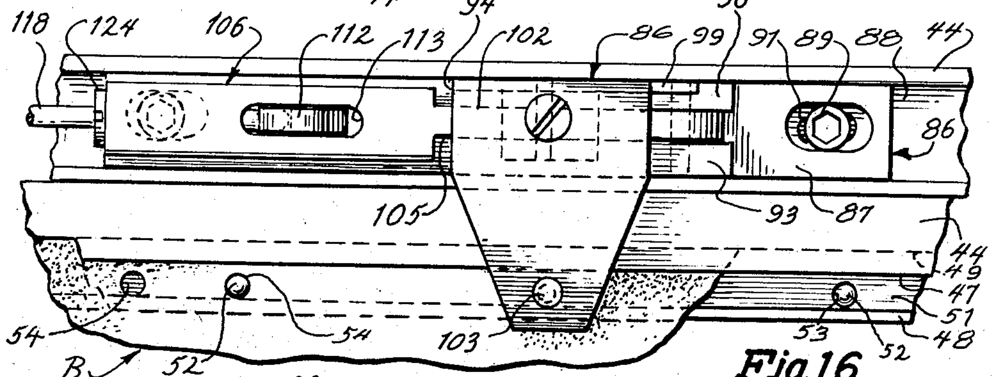
Fig. 16, is a fragmentary top plan view of the mechanism shown in Fig. 15.
Figure 17:
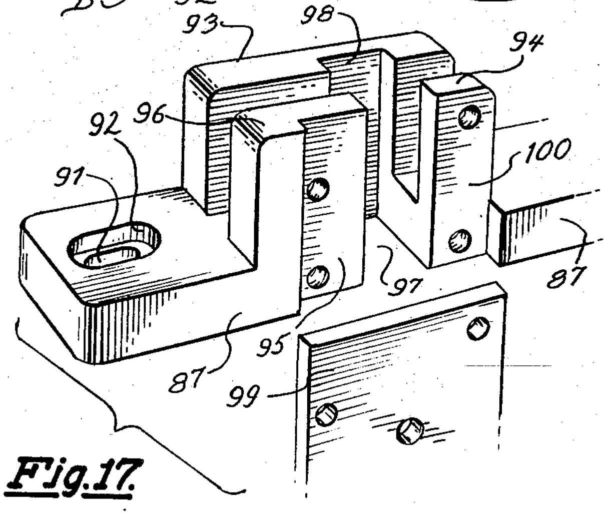
Fig. 17, is a fragmentary perspective view of the frame for the latch, the view being of the side opposite the side shown in Fig. 15.
Figure 18:
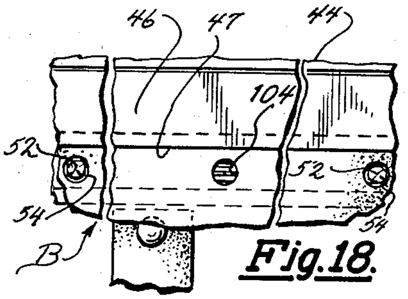
Fig. 18, is a horizontal section taken on line 18—18 of Fig. 13.

A separate transfer mechanism 86, Figs. 15 to 17, is associated with each of the stations P, Q, R, etc. for transferring a board B from one of the stations to the immediately next station after the board has received a circuit component in said one station. All of the transfer mechanisms are carried by the rod 44 and each is similar structurally. Each includes a base 87 which is narrower than the rod 44 and fits into a shallow groove 88 at the top of the rod. Each base 87 is secured to the rod 44 by screws 89. In order that the bases may be anchored to the rod 44 for adjustment, longitudinally thereof, the screws pass through elongated bores 91, in the bases, which extend from elongated counterbores 92, to accommodate the heads of the screws. Intermediate its ends, the base 87 (Fig. 17) includes a flange 93 extending upward from one side thereof. From its opposite side a pair of flanges 94 and 96 extend upward. The flanges 94 and 96 are on either side of a notch 97 which is integral with a vertical groove 98 in the inner side of the flange 93. The open side of the notch 97 is closed by a bearing or cover plate 99 bolted to a seat 95, on the flange 96, and a seat 100, on the flange 94, both seats being provided by areas of reduced thickness on the flanges 94 and 96. Like the walls defining the slot 97, the plate 99 also affords a bearing surface to confine a movable plunger or support 101 for vertical movement. To the upper end of the plunger 101 is bolted a horizontal arm or cantilevered member 102 bearing at its end, remote from the plunger, a pin 103 extending downward. The pin 103 is positioned on the arm 102 at a point directly above the channel 51 of the rail 46. All of the boards B, on the other hand, have central holes 104, at their edges between the holes 54, of diameter to receive the pin 103. Additionally, the pin 103 is so located above the groove 51 that immediately following stripping of the board from the pins 52, by upward movement of the rail 46, the hole 104 is threaded over the pin 103. This operation, of course, takes place before a succeeding board is ejected from the magazine M. Concurrent with ejection of a board from the magazine the blank impaled by the pin 103 is concurrently moved to the immediately next station, the groove 51 affording clearance for the lower end of the pins 103 during their lateral movement. Thus a board having received a component in station P is transferred to station Q while concurrently, by similar means, a board which has just received a component in station Q is transferred to station R to replace one moved to the next station. Thus provision may be made for transferring boards between any number of stations by a repetition of the mechanism 86 on the rod 44.

The mechanism 86 also provides a latched relationship between the pin 103 and the board impaled thereby. The purpose of this relationship is to permit removal of the pin 103 from any one of the boards for removal of the latter from the rail 46 without disturbing the impaled status of the remaining boards. This feature is desirable should one or both of the leads 26 of a circuit component fail to be passed through holes therefor in the board B. Consequently, the mechanism 86 includes a latch lever 106, swingable about a pin 108 carried by the flanges 93 and 96. For its association with the lever 106, the plunger is of inverted U-shape to straddle the lever at a section 105 thereof of reduced width. The section 105, on the other hand, is formed with a longitudinal slot 109 in which is received an operating pin 111 the ends of which are fixed in the respective sides of the plunger. At a point spaced from the flanges 93 and 94, the base carries a lug 112 extending vertically, and when the lever 106 is in its normal position an aperture 113 therein freely receives the lug (Fig. 15). The swingable end portion of the lever 106 has an axial bore 114 opening into the aperture 113, at one of its ends, and into a coaxial counterbore 116 at the other of its ends thereby providing a shoulder 117 at the inner end of the counterbore. A latch rod 118 is slidably journalled in the bore 114 and is formed with a flange 119 thereon within the counterbore 116. From the bore 114 the rod 118 extends into the aperture 113 where it is arranged to extend into a notch 122 in the lug 112, when the lever 106 is in its normal position. In this position the rod 118 is releasably retained by a spring 123, coiled about the latch rod within the counterbore 116 where it is confined between the flange 119 and a nut 124 threaded in the counterbore. The nut 124 has an axial bore 125 in which the rod 118 is slidably received and remote from which the rod terminates in a free end bearing a handle 121. When it is desired to release a board from the pin 103, the handle 121 is grasped and moved against the resistance of the spring 123 until the rod 118 is clear of the notch. Then the lever 106 is swung clockwise (Fig. 15) about the pin 108. The pin 111 pressing upward on the plunger 101 elevates it adequately for the pin 103 to be withdrawn from the board. The pin 103 may then be returned to its normal or latched position by swinging the lever 106 counterclockwise. In the course of this operation the tip of the rod 118, extending from the bore 114, engages a slanting surface or cam 126, formed on the lug 112, which cams the rod 118 to the left against the force of the spring 123 until said rod is opposite the notch 122 into which the rod snaps.

Figures 19, 20:
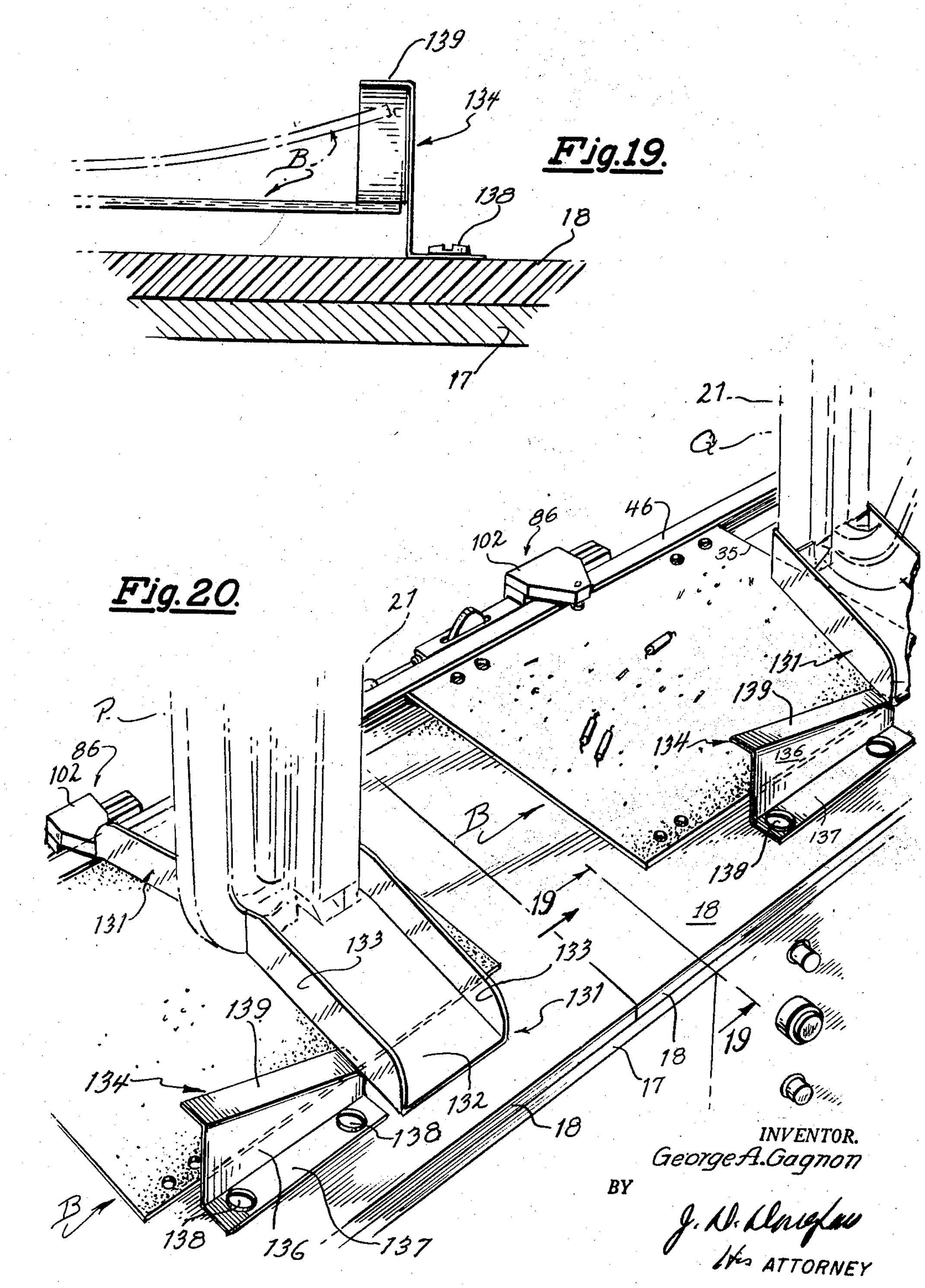
Fig. 19 is a fragmentary section taken on line 19—19 of Fig. 20, showing the effect of the deflector on a warped board.
Fig. 20, is a fragmentary perspective view of two of the component affixing stations showing the chute deflectors.

If desired, mechanism may be employed for guiding portions trimmed from the component leads 26 away from the component affixing heads 21. Suitable mechanism may take the form of troughs or chutes 131 (Fig. 20) fixed to the heads 21 by any suitable means. The chutes comprise base portions 132, slanting downward from the heads to points at the sides of the plates 18 and flanges 133 extending upward from opposite sides of the portions 132.

Some of the boards B slant upward from their supports owning to warpage transversely thereof. Consequently their unsupported portions may be carried at elevations at that of the chutes 131 as the blanks are moved from station to station. Therefore, the upwardly-extending blanks must be depressed to avoid collisions with the chutes. As a safeguard against this danger, deflectors 134 may be employed. A suitable deflector may take the form of a vertical plate 136 of sheet metal having a flange or foot 137 laterally of its lower edge. The plates 136 are arranged just outside of the course of the boards B remote from the rail 46. In this position each deflector is secured by screws 138 passing through the flange 137 and into the plate 18. The plate 136 is triangular and has a second flange or cam 139 laterally of its upper edge which slants downward over the course of the blanks to a level below the bottoms of the chutes. In passing through their course the leading edges 35 of the boards B, engage the cams 139, if their free edges are above the bottoms of the chutes, and ride against the cams under the chutes.

It will thus be seen that I have provided an improved machine wherein, with a minimum of adjustments, it can easily and quickly be arranged for handling boards of various sizes by a simple adjustment at the magazine.

Having thus described the invention, it will be apparent that numerous and extensive departures can be made therefrom by those versed in the art without departing from the spirit or scope of the invention, as defined in the appended claims.

I claim:

1. The combination with a row of stations for successively receiving a printed circuit blank having a plurality of locator portions at one of its edges, a pair of upstanding locator members at each of the stations, horizontal guide means extending throughout the length of the row of stations and arranged to be reciprocated between upper and lower positions thereof, said means being formed with a lateral groove to receive said one edge of said blank whereby it is supported for movement in a course in which the stations are disposed and the blank to be conveyed to a point wherein a pair of the portions are over the members when said means is in its upper position and for the portions to be brought into cooperation with the members when the guide means is moved to its lower position for an operation to be performed on said blank, and means for moving said blank along the guide means to the next station after the member has been moved to its upper position comprising a mobile member supported above the level of said members, said member extending downward for one of the portions to be moved into cooperation therewith following removal of said blank from said locator members, said mobile members being reciprocated laterally to slide said blank along said groove until said pair of portions are above the members of the adjacent station.

2. The combination with a row of stations for successively receiving a printed circuit blank having a plurality of locator holes at one of its edges, of a pair of upstanding locator pins at each of the stations, a horizontal guide member extending throughout the length of the row of stations and arranged to be reciprocated between upper and lower positions thereof, means providing a lateral track on said member to receive said one edge of the blank whereby it is supported for movement in a course in which the stations are disposed and whereby it may be conveyed to a point wherein a pair of the holes found in the blank are over the pins when said member is in its upper position and for a pair of the holes to be threaded over the pins when the member is moved to its lower position for an operation to be performed on said blank, and means for moving said blank along the track to the next station after the member has been moved to its upper position comprising a mobile pin supported above the level of said locator pins, said pin extending downward for one of the holes to be threaded over said mobile pin following removal of said blank from said locator pins, said mobile pin being reciprocated laterally to slide said blank along said track until said pair of holes are above the pins of the adjacent station.

3. The combination with a row of stations in each of which a blank having a plurality of locator portions at one of its edges may be positioned, of a pair of locator members at each of the stations, means to convey a blank to and from each of the stations and secure said blank in corresponding positions therein comprising first and second parallel rails beside the rod, the first rail being arranged to be reciprocated vertically and the second longitudinally, said first rail being formed with a lateral track throughout its length to receive said one edge of the blank whereby the latter is supported in a course in which the stations are disposed for the blank to be conveyed to a point wherein said portions thereof are over the members of one station when said first rail is in its upper position and for the portions to be brought into retentive cooperation with the members when said first rail is moved to its lower position and thereby said blank is secured against horizontal displacement for an operation to be performed thereon, and means for moving said blank along the track to the next station after the first rail has been moved to its upper position comprising a mobile member supported from the second rail, said mobile member being above the level of said members and extending downward and being arranged to cooperate with one of the portions when the first rail is in its upper position for moving said blank along the track when said second rail is reciprocated for said portions to be moved over the locator members of the next adjacent station.

4. In apparatus of the class described including a plurality of spaced stations in a horizontal course for a blank, first and second parallel rails in adjacent relation to each other beside the course, the first rail being arranged for movement between upper and lower positions and the second rail being moved longitudinally thereof following movement of the first rail to its upper position, said first rail having on its side, adjacent the course, a lateral groove extending throughout its length for receiving one edge of the blank to support said blank cantilevered into the course, and a latch mechanism secured on the second rail, said mechanism when latched being arranged to drivingly cooperate with the blank when the first rail is in its upper position for moving said blank along said groove from one station to the next adjacent station when said second rail is operated, said mechanism when unlatched providing for removal thereof from said blank for an emergency removal of said blank from said groove.

5. In apparatus of the class described including a plurality of spaced stations in the course of a blank having a plurality of holes at one of its edges, first and second parallel rails beside the course, the first rail being arranged to be reciprocated between upper and lower positions and the second rail arranged to be reciprocated longitudinally following movement of said first rail to its upper position, said first rail having a lateral track throughout its length to receive said one edge for said blank to be supported in the course, a pair of locator pins at each of the stations for entering the holes for guiding said blank into a predetermined position as said first rail is lowered and for confining said blank in the track, and a latch mechanism secured to the second rail and when latched being arranged to anchor said one edge in the track when said first rail is in its upper position and said blank is out of engagement with the pins for said blank to be slid along the track when said second rail is operated to position the holes over the pins of the next adjacent station so that said holes may be threaded over said pins when said first rail is moved downward, said mechanism when unlatched providing for removal of the blank from the first rail in an emergency by disengagement of the latch from said blank.

6. In apparatus of the class described including a plurality of spaced stations in the course of a blank having a plurality of locator portions at one of its edges, first and second parallel rails beside the course, the first rail being arranged to be reciprocated between upper and lower positions and the second rail arranged to be reciprocated longitudinally thereof following movement of said first rail to its upper position, said first rail having a lateral groove throughout its length to receive said one edge of said blank to be supported in the course, a pair of locator members at each of the stations for cooperation with a pair of the portions for guiding said blank into a predetermined position as said first rail is lowered to its lower position and for confining said blank in the groove, a mobile member above the level of said members, said member being supported from said second rail and serving to anchor said one edge in the groove by engaging a vertical edge of said blank remote from said one edge when said first rail is moved to its upper position and thereby the blank removed from the members for it to be moved along the groove by said member to a point wherein said portions are in readiness for cooperation with the members of the next adjacent station when said first rail is then lowered, and latch mechanism supporting said member from the second rail, said mechanism when latched retaining said member in position for cooperation with said portion but when unlatched permitting said member to be manually disengaged from said blank in an emergency.

7. In apparatus of the class described including a plurality of spaced stations in a horizontal course for a blank, first and second parallel rails in adjacent relation to each other beside the course, the first rail being arranged for movement between upper and lower positions and the second rail being movable longitudinally thereof following movement of the first rail to its upper position, said first rail having on its side adjacent the course a lateral groove extending throughout its length for receiving one edge of the blank to support said blank in the course, a latch mechanism including a bearing on the second rail, a blank keeper journalled in the bearing for vertical movement and extending over the course, a latch lever pivoted to the bearing and articulately coupled to the keeper for moving said keeper vertically when said lever is swung about its pivot, a spring-pressed latch member on the lever, a hook member on the bearing, and a cam on one of the members, said members cooperating with each other on movement of said lever toward said hook for said latch to be cammed against the spring pressure until said latch is in hooked relation to said hook and concurrently said keeper moved to a latched position for retaining the blank in the groove by engaging one of its edges at one station and for sliding the blank along the groove to another station, said latch being manually movable against the spring pressure for being unlatched from said hook to free said lever to be swung away from said hook and concurrently for said keeper to be moved out of engagement with said blank so that the latter may be removed from the groove in an emergency.

8. In apparatus of the class described including a plurality of spaced stations in a horizontal course for a blank, first and second rails beside the course, the first rail being arranged to occupy upper and lower positions and the second rail being arranged to be reciprocated horizontally thereof when the first rail is in its upper position, said first rail being formed with a groove throughout its length to receive one edge of the blank, means for retaining in said groove said blank supported over the course when said first rail is in its upper position including a retainer supported from the second rail and engaging a vertical surface of the blank remote from its one edge and for moving said blank to an adjacent station by sliding said blank along the groove when said second rail is moved in one direction, means for lowering the blank from its position to the support of the station moved to by lowering said first rail for an operation to be performed on said blank and for returning said blank to its raised position comprising a cam member, a follower member cooperating with the cam, one of the members being reciprocated horizontally to move said other member vertically, and guided linkage connecting said other member to said first rail for communicating movement of said one member to said blank.

9. In apparatus of the class described including a plurality of spaced stations in a horizontal course for a blank, a transfer rod beside the course, a track rail arranged for vertical movement intermediate the course and rod, the operation of said rod being timed relative to said rail for said rod to move longitudinally forward when said rail is in an upper position and the rod to be moved backward when said rail is in a downward position, said rail being formed with a lateral track throughout its length to receive one edge of the blank, a retainer supported from the rod for retaining said blank in said track by engaging the blank remote from its track-engaged edge whereby said blank is supported over the course when said rail is upward and for moving said blank to an adjacent station by sliding it along the track when said rod is moved forward, a horizontally reciprocated operating rod below the level of the course, a cam member, a follower member cooperating with the cam, one of the members being fixed to the operating rod, and a linkage confined for vertical movement connecting said other member to said track rail for supporting said blank in its cantilevered position and for freeing it from the retainer by lowering it for support by said station where an operation may be performed on said blank when said operating rod may be moved backward and said blank then returned to its cantilevered position.

10. A machine for handling circuit boards and for attaching circuit elements to said boards including, a track means and a plurality of stations disposed alongside said track, said track comprising a single track formed with a laterally extending groove for receiving one edge of said board and being movable between upper and lower positions, a transport mechanism for moving said board cyclically between stations disposed alongside said track, means cooperating with said track member to hold said board in said groove comprising locator pins supported in each of said stations disposed at spaced intervals along said track for holding said board when it is lowered and a second support pin for engaging said board when it is raised and for moving the board between stations upon reciprocation of the support.

11. A device as described in claim 10 wherein the second support pin is carried by the transport mechanism and means is provided to move the transport cyclically to move the board when it is in the raised position and to return to its original position when the board is in its lowered position.

References Cited in the file of this patent

UNITED STATES PATENTS

| | | |
|---|---|---|
| 1,181,276 | Weber | May 2, 1916 |
| 1,280,410 | Craig | Oct. 1, 1918 |
| 1,560,373 | Birnstock | Nov. 3, 1925 |
| 1,736,935 | Navarre | Nov. 26, 1929 |
| 1,886,378 | Dearsley | Nov. 8, 1932 |
| 2,398,659 | Mead | Apr. 16, 1946 |
| 2,566,951 | Mills | Sept. 4, 1951 |
| 2,677,543 | Ohrn | May 4, 1954 |